United States Patent
Stainer

(10) Patent No.: US 9,905,283 B2
(45) Date of Patent: Feb. 27, 2018

(54) SELF-REFERENCED MRAM CELL AND MAGNETIC FIELD SENSOR COMPRISING THE SELF-REFERENCED MRAM CELL

(71) Applicant: CROCUS Technology SA, Grenoble (FR)

(72) Inventor: Quentin Stainer, Montbonnot-St-Martin (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 15/516,098

(22) PCT Filed: Sep. 24, 2015

(86) PCT No.: PCT/EP2015/072029
§ 371 (c)(1),
(2) Date: Mar. 31, 2017

(87) PCT Pub. No.: WO2016/050614
PCT Pub. Date: Apr. 7, 2016

(65) Prior Publication Data
US 2017/0243625 A1    Aug. 24, 2017

(30) Foreign Application Priority Data

Oct. 3, 2014   (EP) ..................... 14290298

(51) Int. Cl.
*G11C 11/16*     (2006.01)
*G01R 33/09*     (2006.01)

(52) U.S. Cl.
CPC ........ *G11C 11/1675* (2013.01); *G01R 33/098* (2013.01); *G11C 11/161* (2013.01); *G11C 11/1673* (2013.01)

(58) Field of Classification Search
CPC .................................................. G11C 11/1675
(Continued)

(56) References Cited

U.S. PATENT DOCUMENTS

| | | | | |
|---|---|---|---|---|
| 6,501,678 B1 * | 12/2002 | Lenssen | ............... | G11C 11/16 365/158 |
| 2005/0173771 A1 * | 8/2005 | Sharma | ............... | G11C 11/16 257/421 |

(Continued)

FOREIGN PATENT DOCUMENTS

EP   2528060 A1   11/2012

OTHER PUBLICATIONS

International Search Report for PCT/EP2015/072029 dated Dec. 8, 2015.
Written Opinion for PCT/EP2015/072029 dated Dec. 8, 2015.

*Primary Examiner* — Son Mai
(74) *Attorney, Agent, or Firm* — Pearne & Gordon LLP

(57) ABSTRACT

A self-referenced MRAM cell including a reference layer having a fixed reference magnetization, a sense layer having a free sense magnetization, a tunnel barrier, a biasing layer having bias magnetization and a biasing antiferromagnetic layer pinning the bias magnetization in a bias direction when MRAM cell is at temperature equal or below a bias threshold temperature. The bias magnetization is arranged for inducing a bias field adapted for biasing the sense magnetization in a direction opposed to the bias direction, such that the biased sense magnetization varies linearly in the presence of the external magnetic field, when the external magnetic field is oriented in a direction substantially perpendicular to the one of the reference magnetization. The present disclosure further concerns a magnetic field sensor including a plurality of the self-referenced MRAM cell and a method for programming the magnetic field sensor.

18 Claims, 3 Drawing Sheets

(58) Field of Classification Search
USPC .......................................................... 365/158
See application file for complete search history.

(56) References Cited

U.S. PATENT DOCUMENTS

2007/0063236 A1* 3/2007 Huai ..................... G11C 11/161
                                                                                                   257/295
2013/0107614 A1    5/2013  Keshtbod

* cited by examiner

SELF-REFERENCED MRAM CELL AND MAGNETIC FIELD SENSOR COMPRISING THE SELF-REFERENCED MRAM CELL

FIELD

The present disclosure concerns a self-referenced MRAM cell for measuring an external magnetic field and a magnetic field sensor comprising the self-referenced MRAM cell. The present disclosure further concerns a method for programming a magnetic field sensor.

DESCRIPTION OF RELATED ART

Self-referenced MRAM cells can be used to sense magnetic fields, in magnetic sensors or compasses. The MRAM cell comprises a magnetic tunnel junction including a reference layer having a fixed reference magnetization, a sense layer having a free sense magnetization and a tunnel barrier layer between the sense layer and the reference layer. The reference magnetization and the sense magnetization can be oriented parallel to the plane of the reference and sense layers. A change in orientation of the sense layer is typically used to measure the external magnetic field. A sensor device can be formed from a plurality of self-referenced MRAM cells arranged in a circuit configuration and advantageously used to amplify the measured response in relation with the external magnetic field. For example, a plurality of self-referenced MRAM cells arranged in a Wheatstone bridge configuration has been proposed to that end.

FIG. 1 shows a conventional Wheatstone bridge comprising two resistances R1, R2 connected in series in parallel to two other resistances R3, R4 connected in series. In the circuit of FIG. 1, each resistance can correspond to a self-referenced MRAM cell.

A linear variation of the measured voltage $V_{out}$ in the presence of the external magnetic field can be obtained for such Wheatstone bridge when the external magnetic field is oriented perpendicular to the reference magnetization direction and when the sense magnetization is oriented at about 45° relative to the reference magnetization direction. During a sensing operation, orienting the sense magnetization at about 45° relative to the reference magnetization direction is achieved by applying a magnetic field induced by a field current passing in a field line. Since the field current must be passed during the whole sensing operation, operating such known sensor device implies a static power consumption resulting in a lowered lifetime due to electromigration phenomena.

SUMMARY

The present disclosure concerns a self-referenced MRAM cell comprising a reference layer having a fixed reference magnetization direction, a sense layer having a sense magnetization that is freely orientable in an external magnetic field, and a tunnel barrier comprised between the reference and sense layers; the MRAM cell further comprising a biasing layer having a bias magnetization and a biasing antiferromagnetic layer pinning the bias magnetization in a bias direction when the MRAM cell is at a temperature equal or below a bias threshold temperature; the bias magnetization being arranged for inducing a bias field adapted for biasing the sense magnetization in a direction opposed to the bias direction, such that the direction of the biased sense magnetization varies linearly in the presence of an external magnetic field, when such external magnetic field is oriented in a direction substantially perpendicular to the one of the reference magnetization.

The present disclosure further concerns a magnetic field sensor comprising a current line electrically connecting in series a plurality of MRAM cells; the current line being arranged for passing a heating current adapted for heating the MRAM cells above the bias threshold temperature; and a field line for passing a programming field current inducing a magnetic field adapted for aligning the bias magnetization of the MRAM cells in the bias direction, when the MRAM cell is heated at a temperature above the bias threshold temperature.

The present disclosure also pertains to a method for programming a magnetic field sensor comprising heating any one of the plurality of MRAM cells to a temperature above the bias threshold temperature such as to free the bias magnetization in said any one of the plurality of MRAM cells; aligning the bias magnetization of the heated MRAM cell in the bias direction; and cooling said heated MRAM cell to a temperature below the bias threshold temperature such as to pin the bias magnetization in the bias direction.

Since the heating current (or heating voltage pulse) and the programming field current need to be passed only during the programming operation that is much shorter than a sensing operation, the magnetic field sensor disclosed herein requires much less static power consumption and can have a significantly extended lifetime.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
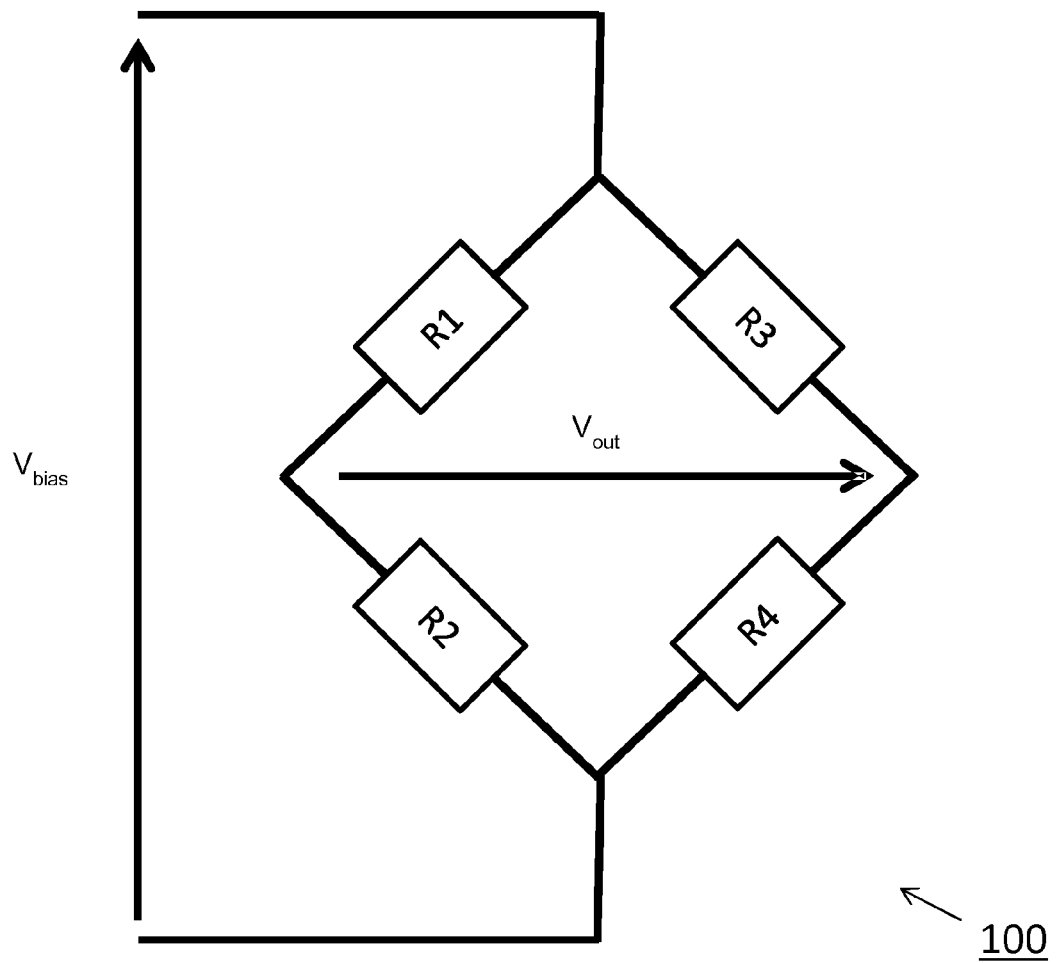
FIG. 1 illustrates a conventional Wheatstone bridge structure.
Figure 2:
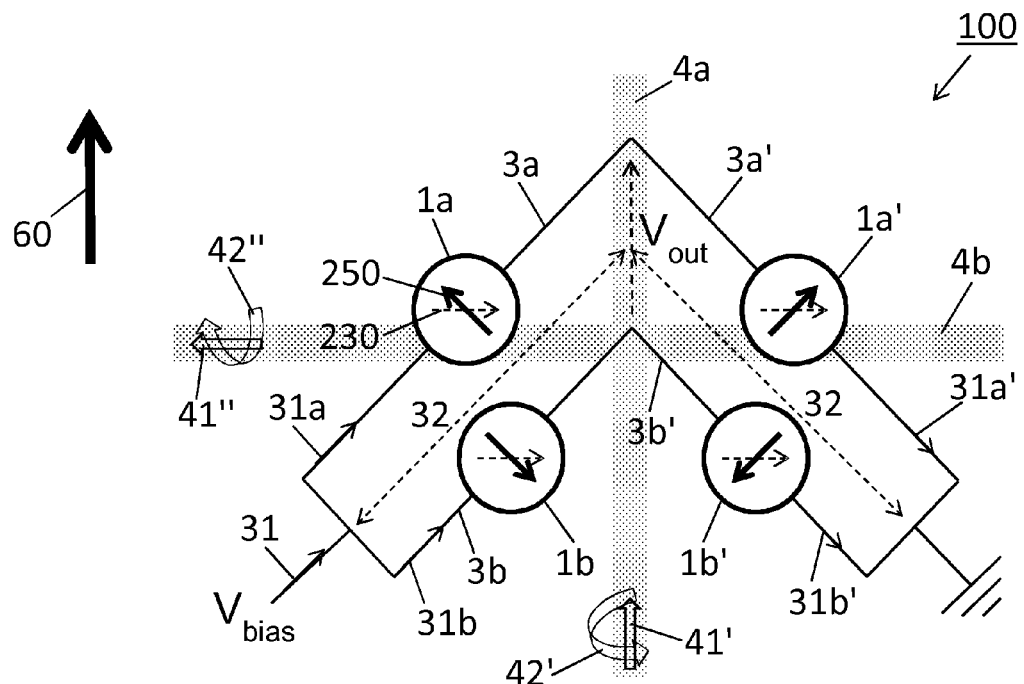
FIG. 2 magnetic field sensor according to an embodiment.

FIG. 2 shows a magnetic field sensor 100 according to an embodiment. The magnetic field sensor 100 comprises four current branches (3a, 3a', 3b, 3b') connected in a Wheatstone bridge circuit configuration. In particular, a first branch 3a and a second branch 3a' electrically connect in series a first MRAM cell 1a and a second MRAM cell 1a', respectively. A third branch 3b and a fourth branch 3b' electrically connect in series a third MRAM cell 1b and a fourth MRAM cell 1b', respectively. The first and second branches 3a, 3a' are electrically connected in parallel to the third and fourth branches 3b, 3b' forming the Wheatstone bridge circuit.

Figure 4:
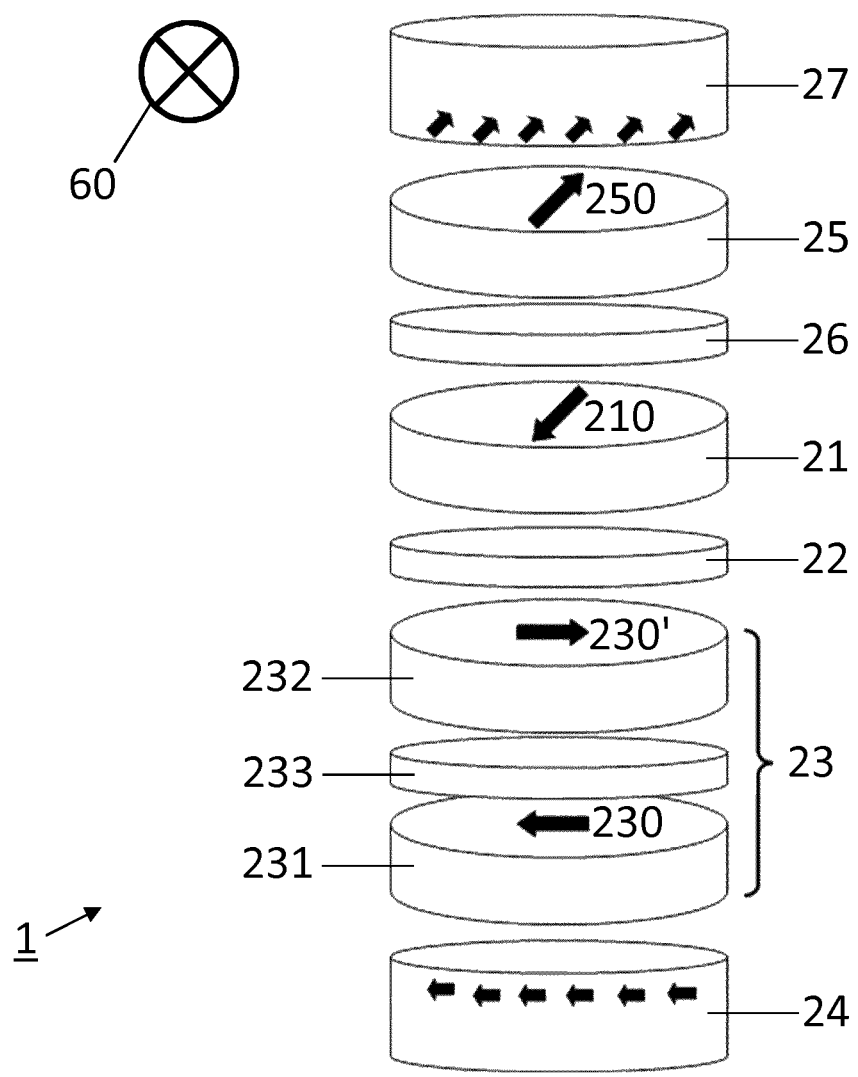
FIG. 4 represents a cross section view of a MRAM cell, according to an embodiment.

FIG. 4 represents a cross section view of a MRAM cell 1 corresponding to any one of the MRAM cells 1a, 1a', 1b, 1b', according to an embodiment. The MRAM cell 1 comprises a reference layer 23 having a fixed reference magnetization 230, a sense layer 21 having a sense magnetization 210 that is freely orientable in an external magnetic field 60, and tunnel barrier 22 comprised between the reference and sense layers 23, 21.

Each of the sense layer 21 and the reference layer 23 includes, or is formed of, a magnetic material and, in particular, a magnetic material of the ferromagnetic type. A ferromagnetic material can be characterized by a particular coercivity, which is indicative of a magnitude of a magnetic field to reverse the magnetization after it is driven to saturation in one direction. In general, the sense layer 21 and the reference layer 23 can include the same ferromagnetic material or different ferromagnetic materials. The sense layer 21 can include a soft ferromagnetic material, namely one having a relatively low coercivity, while the reference layer 23 can include a hard ferromagnetic material, namely one having a relatively high coercivity. In such manner, a magnetization of the sense layer 21 can be readily varied under low-intensity magnetic fields. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. In some instances, alloys based on Ni and Fe (and optionally B) can have a smaller coercivity than alloys based on Co and Fe (and optionally B). A thickness of each of the sense layer 21 and the reference layer 23 can be in the nm range, such as from about 1 nm to about 20 nm or from about 1 nm to about 10 nm. Other implementations of the sense layer 21 and the reference layer 23 are contemplated. For example, either, or both, of the sense layer 21 and the reference layer 23 can include multiple sub-layers in a fashion similar to that of the so-called synthetic antiferromagnetic layer The tunnel barrier layer 22 can include, or be formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 10 nm.

Referring to FIG. 4, the MRAM cell 1 may further include a reference antiferromagnetic layer 24, which is disposed adjacent to the reference layer 23 and, through exchange bias, pins the reference magnetization 230 along a particular direction when a temperature within, or in the vicinity of, the reference antiferromagnetic layer 24 is at a low threshold temperature $T_L$, i.e., below a blocking temperature, such as a Neel temperature, or another threshold temperature of the reference antiferromagnetic layer 24. The reference antiferromagnetic layer 24 unpins, or frees, the reference magnetization 230 when the temperature is at the high threshold temperature $T_H$, i.e., above the blocking temperature, thereby allowing the reference magnetization 230 to be switched to another direction. In the particular example of FIG. 4, the reference layer 23 is represented as a synthetic antiferromagnet (SAF) structure including a first reference sub-layer 231 having a first reference magnetization 230 and a second reference sub-layer 232 having a second reference magnetization 230' and a non-magnetic coupling layer 233 separating the first and second reference ferromagnetic layers 231, 232.

The reference antiferromagnetic layer 24 includes, or is formed of, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). For example, the reference antiferromagnetic layer 24 can include, or be formed of, an alloy based on Ir and Mn (or based on Fe and Mn) having a high threshold temperature $T_H$ in the range of about 120° C. to about 220° C. Because the sense magnetization 210 is unpinned, the high threshold temperatures $T_H$ can be selected to accommodate a desired application, such as a high temperature application, in the absence of, or without regard to, a threshold temperature that would otherwise set an upper bound of an operating temperature window. The sense magnetization 210 is freely adjustable at the low and high threshold temperatures $T_L$, $T_H$. This type of MRAM cell 1 comprising the sense layer 21 with the freely adjustable sense magnetization 210 is known as self-referenced MRAM cell.

The MRAM cell 1 further comprises a biasing layer 25 having bias magnetization 250 and a biasing antiferromagnetic layer 27 pinning the bias magnetization 250 in a bias direction when MRAM cell 1 is at temperature equal or below a bias threshold temperature $T_B$. A decoupling layer 26 can be disposed between the sense layer 21 and the biasing layer 25, such that no direct RKKY coupling between the biasing layer 25 and the sense layer 21 occurs.

The bias magnetization 250 is configured for inducing a bias field 251 adapted for biasing the sense magnetization 210 in a direction opposed to the bias direction due to magnetic coupling between the biasing layer 25 and the sense layer 21. The bias direction can be oriented such as to form an angle between a direction parallel and a direction orthogonal to the one of the reference magnetization 230. The sense magnetization 210 biased by the bias field 251 induced by the bias magnetization 250 in such bias direction can then vary linearly in the presence of the external magnetic field 60 oriented in a direction substantially perpendicular to the direction of the reference magnetization 230.

The direction of the reference magnetization 230 can be set by using an annealing step under an external magnetic field.

In an embodiment, the bias threshold temperature $T_B$ is lower than the reference threshold temperature $T_R$.

Turning back to FIG. 2, a method for programming the magnetic field sensor 100, in accordance with an embodiment, comprises:

heating any one of the MRAM cells 1a, 1a', 1b, 1b' to a temperature above the bias threshold temperature $T_B$ such as to free the bias magnetization 250;

aligning the bias magnetization 250 of the heated MRAM cell (1) in the bias direction; and cooling the heated MRAM cells 1a, 1a', 1b, 1b' to a temperature below the bias threshold temperature $T_B$ such as to pin the bias magnetization 250 in the bias direction.

In particular, the steps of heating, aligning the bias magnetization 250 and cooling can be performed sequentially for the first and second MRAM cells 1a, 1a', and for the third and fourth MRAM cells 1b, 1b'.

In an embodiment, heating the MRAM cells 1a, 1a', 1b, 1b' comprises sequentially applying a heating voltage pulse 32 (see FIG. 2) across the first, second, third and fourth current branches 3a, 3a', 3b, 3b' for heating the first second, third and fourth MRAM cells 1a, 1a', 1b, 1b' at or above the bias threshold temperature $T_B$.

Alternatively, heating the MRAM cells 1a, 1a', 1b, 1b' comprises sequentially passing the heating current pulse 31 in the first, second, third and fourth current branches 3a, 3a', 3b, 3b' for heating the first second, third and fourth MRAM cells 1a, 1a', 1b, 1b' at or above the bias threshold temperature $T_B$.

In embodiment shown in FIG. 2, the programming field line 4 comprises a first programming field line portion 4a configured for passing a first programming field current 41' inducing a first programming magnetic field 42'. The programming field line 4 further comprises a second field line portion 4b arranged substantially orthogonal to the first programming field line portion 4a and configured for passing a second programming field current 41" inducing a second programming magnetic field 42".

The step of aligning the bias magnetization 250 thus comprises passing the first programming field current 41' in the first programming field line 4a and passing the second programming field current 41" in the second programming field line 4b. The resultant programming magnetic field 42 is adapted for aligning the bias magnetization 250 of the first second, third or fourth MRAM cell 1 being heated at or above the bias threshold temperature $T_B$. The orientation of the resultant programming magnetic field 42 depends on the relative magnitude and polarity of the first and second programming field current 41', 41". Thus, the bias direction of the bias magnetization 250 can be adjusted to any suitable orientation by adjusting the magnitude and polarity of the first and second programming field current 41', 41".

The step of aligning the bias magnetization 250 can thus be performed such that the bias direction makes an angle between a direction parallel and a direction orthogonal to the one of the reference magnetization 230.

The step of aligning the bias magnetization 250 can further be performed such that the bias direction of the MRAM cells 1 in the first and second subset 1a, 1a' is about −45° and 45° relative to the one of the reference magnetization 230, respectively, and the bias direction of the MRAM cells 1 in the third and fourth subset 1b, 1b' is about 135° and −135° relative to the one of the reference magnetization 230, respectively.

The magnetic field sensor 100 is not limited to the configuration shown in FIG. 2. For example, the magnetic field sensor 100 can comprise a plurality of the MRAM cells 1. In particular, the first branch 3a can electrically connect in series a first subset 1a of the plurality of MRAM cells 1, the second branch 3a' can electrically connect in series a second subset 1a' of the plurality of MRAM cells 1, the third branch 3b can electrically connect in series a third subset 1b of the plurality of MRAM cells 1 and the fourth branch 3b' can electrically connect in series a fourth subset 1b' of the plurality of MRAM cells 1.

During the programming operation of the magnetic field sensor 100, the steps of heating, aligning the bias magnetization 250 and cooling are performed sequentially for the MRAM cells 1 comprised in the first, second, third and fourth subset 1a, 1a', 1b, 1b'.

In particular, heating the MRAM cells 1 comprises sequentially applying a heating voltage pulse 32 across, or passing the heating current pulse 31 in, the first, second, third and fourth current branches 3a, 3a', 3b, 3b' for sequentially heating the first second, third and fourth subsets 1a, 1a', 1b, 1b' of MRAM cells 1 at or above the bias threshold temperature $T_B$. Each of the first, second, third and fourth subset 1a, 1a', 1b, 1b' can be heated independently at or above the bias threshold temperature $T_B$. In reference to FIG. 2, this can be performed by passing, independently, a first heating current pulse 31a in the first current branch 3a, a second heating current pulse 31a' in the second current branch 3a', a third heating current pulse 31b in the third current branch 3b and a fourth heating current pulse 31b' in the fourth current branch 3b'.

Once the MRAM cells 1 in one of the subsets 1a, 1a', 1b, 1b' has been heated at or above the bias threshold temperature $T_B$, the first and second programming field currents 41', 41" can be passed respectively in the first and second programming field lines 4a, 4b, such as to induce respectively a first and second programming magnetic field 42' and 42". The bias magnetization 250 of the heated MRAM cells (1) in one of the subsets 1a, 1a', 1b, 1b' is aligned in accordance with the programming magnetic field 42 resulting from the combination of the first and second programming magnetic fields 42' and 42", induced respectively by the first and second programming field currents 41' and 41"

Depending on the orientation of the resultant programming magnetic field 42, the bias magnetization 250 can be aligned in any suitable bias direction. For example, the bias magnetization 250 of the MRAM cells 1 in the first, second, third and fourth subsets 1a, 1a', 1b, 1b' can have a bias direction oriented at about −45°, 45°, 135° and −135°, respectively, relative to the reference magnetization 230, or any other suitable orientations.

After performing the programming operation, the programmed magnetic field sensor 100 can be used for sensing an external magnetic field 60.

Turning back to FIG. 2, the Wheatstone bridge magnetic field sensor 100 can be used for sensing a component direction of an external magnetic field 60 oriented substantially in the plane of the MRAM cell layers 21, 23 and perpendicular to the direction of the reference magnetization 230 (determined during the annealing step).

In the case the bias direction of the bias magnetization 250 is oriented such as to form an angle between a direction parallel and a direction orthogonal to the one of the reference magnetization 230, the sense magnetization 210, biased by the bias field 251 induced by the bias magnetization 250, will vary substantially linearly with the component of the external magnetic field 60 being oriented substantially perpendicular to the direction of the reference magnetization 230.

Figure 3:
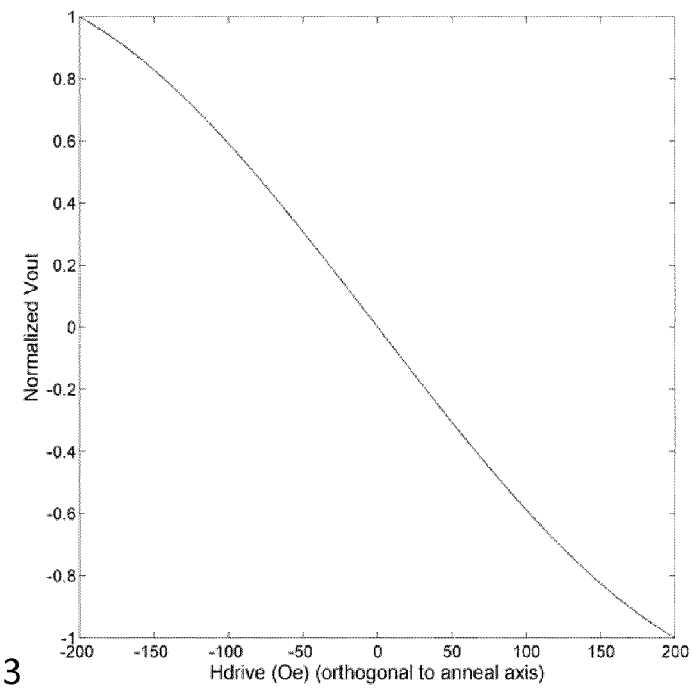
FIG. 3 shows a graph of a voltage response measured with the magnetic field sensor of FIG. 2.

FIG. 3 shows a graph of a voltage response, $V_{out}$, measured between the first and second branches 3a, 3a' and the third and fourth branches 3b, 3b' of the magnetic field sensor 100 shown in FIG. 2, in the presence of the external magnetic field 60 (component oriented substantially perpendicular to the direction of the reference magnetization 230).

| Reference numbers and symbols | |
|---|---|
| 1 | self-referenced MRAM cell |
| 1a | first subset |
| 1a' | second subset |
| 1b | third subset |
| 1b' | fourth subset |
| 100 | magnetic field sensor |
| 21 | sense layer |
| 210 | sense magnetization |
| 22 | tunnel barrier |
| 23 | reference layer |
| 230 | reference magnetization |
| 24 | reference antiferromagnetic layer |
| 25 | pinned biasing layer |
| 250 | pinned biasing magnetization |
| 26 | decoupling layer |
| 27 | biasing antiferromagnetic layer |
| 3 | first current line |
| 3a | first branch |
| 3a' | second branch |
| 3b | third branch |
| 3b' | fourth branch |
| 31 | heating current pulse |
| 31a | first portion of the heating current |
| 31a | second portion of the heating current |
| 31b | third portion of the heating current |

-continued

| Reference numbers and symbols | |
|---|---|
| 31b' | fourth portion of the heating current |
| 32 | heating voltage pulse |
| 4 | programming field line |
| 4a | first programming field line |
| 4b | second programming field line |
| 41 | programming field current |
| 41' | first programming field current |
| 41" | second programming field current |
| 42 | programming magnetic field |
| 42' | first programming magnetic field |
| 42" | second programming magnetic field |
| $T_B$ | bias temperature |
| $T_H$ | high threshold temperature |
| $T_L$ | low threshold temperature |
| $V_{bias}$ | heating voltage pulse |
| $V_{out}$ | voltage response |

What is claimed is:

1. A self-referenced MRAM cell comprising a reference layer having a fixed reference magnetization, a sense layer having a sense magnetization that is freely orientable in an external magnetic field, and a tunnel barrier comprised between the reference and sense layers;
wherein
the MRAM cell further comprises a biasing layer having a bias magnetization and a biasing antiferromagnetic layer pinning the bias magnetization in a bias direction when MRAM cell is at temperature equal or below a bias threshold temperature;
and wherein
the bias magnetization is arranged for inducing a bias field adapted for biasing the sense magnetization in a direction opposed to the bias direction, such that the biased sense magnetization varies linearly in the presence of the external magnetic field, when the external magnetic field is oriented in a direction substantially perpendicular to the one of the reference magnetization.

2. The MRAM cell according to claim 1, wherein the MRAM cell further comprises a reference antiferromagnetic layer pinning the reference magnetization when the MRAM cell is at a temperature equal or lower to a reference threshold temperature; the bias threshold temperature being lower than the reference threshold temperature.

3. The MRAM cell according to claim 1, wherein the bias direction forms an angle between a direction parallel and a direction orthogonal to the one of the reference magnetization.

4. The MRAM cell according to claim 1,
wherein the MRAM cell further comprises a decoupling layer between the sense layer and the biasing layer, such that no direct RKKY coupling between the biasing layer and the sense layer occurs.

5. A magnetic field sensor comprising:
a current line electrically connecting in series a plurality of MRAM cells; each MRAM cell comprising a reference layer having a fixed reference magnetization, a sense layer having a sense magnetization that is freely orientable in an external magnetic field, a tunnel barrier comprised between the reference and sense layers, a biasing layer having a bias magnetization, and a biasing antiferromagnetic layer pinning the bias magnetization in a bias direction when MRAM cell is at temperature equal or below a bias threshold temperature; the bias magnetization being arranged for inducing a bias field adapted for biasing the sense magnetization in a direction opposed to the bias direction, such that the biased sense magnetization varies linearly in the presence of the external magnetic field, when the external magnetic field is oriented in a direction substantially perpendicular to the one of the reference magnetization;
the current line being arranged for passing a heating current adapted for heating the MRAM cells above the bias threshold temperature; and
a programming field line for passing a programming field current inducing a magnetic field adapted for aligning the bias magnetization of the MRAM cells in the bias direction, when the MRAM cell is heated at a temperature above the bias threshold temperature.

6. The magnetic field sensor according to claim 5, wherein the bias direction is aligned at an angle between a direction parallel and a direction orthogonal to the one of the reference magnetization.

7. The magnetic field sensor according to claim 5, wherein the current line comprises:
a first and second branch connecting in series a first and second subset of the plurality of MRAM cells, respectively; and
a third and fourth branch connecting in series a third and fourth subset of the plurality of MRAM cells, respectively;
the first and second branch being electrically connected in parallel to the third and fourth branch in a Wheatstone bridge circuit configuration.

8. The magnetic field sensor according to claim 7, wherein the programming field line comprises:
a first programming field line portion configured for passing a first programming field current inducing a first programming magnetic field; and
a second field line portion arranged substantially orthogonal to the first programming field line portion and configured for passing a second programming field current inducing a second programming magnetic field;
the programming magnetic field resultant from the combination of the first and second programming magnetic field being adapted for aligning the bias magnetization of any one of the MRAM cells comprised in the subsets.

9. The magnetic field sensor according to claim 7, wherein the bias direction of the MRAM cells in the first and second subset is about −45° and 45° relative to the one of the reference magnetization, respectively; and
wherein the bias direction of the MRAM cells in the third and fourth subset is about 135° and −135° relative to the one of the reference magnetization, respectively.

10. A method for programming a magnetic field sensor, comprising:
a current line electrically connecting in series a plurality of MRAM cells; each MRAM cell comprising a reference layer having a fixed reference magnetization, a sense layer having a sense magnetization that is freely orientable in an external magnetic field, a tunnel barrier comprised between the reference and sense layers, a biasing layer having a bias magnetization, and a biasing antiferromagnetic layer pinning the bias magnetization in a bias direction when MRAM cell is at temperature equal or below a bias threshold temperature; the bias magnetization being arranged for inducing a bias field adapted for biasing the sense magnetization in a direction opposed to the bias direction, such that the biased sense magnetization varies linearly in the presence of the external magnetic field, when the external magnetic field is oriented in a direction substantially perpendicular to the one of the reference magnetization
the current line being arranged for passing a heating current adapted for heating the MRAM cells above the bias threshold temperature; and
a programming field line for passing a programming field current inducing a magnetic field adapted for aligning the bias magnetization of the MRAM cells in the bias direction, when the MRAM cell is heated at a temperature above the bias threshold temperature;
the method comprising:
heating any one of the plurality of MRAM cells to a temperature above the bias threshold temperature such as to free the bias magnetization in said any one of the plurality of MRAM cells;
aligning the bias magnetization of the heated MRAM cell in the bias direction; and
cooling said heated MRAM cell to a temperature below the bias threshold temperature such as to pin the bias magnetization in the bias direction.

11. The method according to claim 10,
wherein said heating any one of the plurality of MRAM cells comprises applying a heating voltage pulse across the current line, or passing a heating current in the current line.

12. The method according to claim 10,
wherein said aligning the bias magnetization comprises passing a programming field current inducing a magnetic field adapted for aligning the bias magnetization.

13. The method according to claim 10, wherein the current line comprises a first and second branch connecting in series a first and second subset of the plurality of MRAM cells, respectively; and a third and fourth branch connecting in series a third and fourth subset of the plurality of MRAM cells, respectively; the first and second branch being electrically connected in parallel to the third and fourth branch in a Wheatstone bridge circuit configuration;
and wherein the method comprises:
performing the steps of heating, aligning the bias magnetization and cooling sequentially for the MRAM cells comprised in the first, second, third and fourth subset.

14. The method according to claim 13,
wherein the step of heating comprises sequentially applying the heating voltage pulse across the first, second, third and fourth current branches for heating the MRAM cells comprised in the first second, third and fourth subset, respectively, at or above the bias threshold temperature.

15. The method according to claim 13,
wherein the step of heating comprises sequentially passing the heating current pulse in the first, second, third and fourth current branches for heating the MRAM cells comprised in the first second, third and fourth subset, respectively, at or above the bias threshold temperature.

16. The method according to claim 14,
wherein the programming field line comprises a first programming field line portion configured for passing a first programming field current inducing a first programming magnetic field; and a second field line portion arranged substantially orthogonal to the first programming field line portion and configured for passing a second programming field current inducing a second programming magnetic field; the programming magnetic field resultant from the combination of the first and second programming magnetic field being adapted for aligning the bias magnetization of any one of the MRAM cells comprised in the subsets; and
wherein the step of aligning the bias magnetization comprises:
passing the first programming field current in the first programming field line and passing the second programming field current in the second programming field line for aligning the bias magnetization of the MRAM cells comprised in the subset being heated at or above the bias threshold temperature in accordance with the resultant programming magnetic field.

17. The method according to claim 10,
wherein the step of aligning the bias magnetization is performed such that the bias direction makes an angle between a direction parallel and a direction orthogonal to the one of the reference magnetization.

18. The method according to claim 16, wherein the step of aligning the bias magnetization is performed such that:
the bias direction of the MRAM cells in the first and second subset is about −45° and 45° relative to the one of the reference magnetization, respectively; and
the bias direction of the MRAM cells in the third and fourth subset is about 135° and −135° relative to the one of the reference magnetization, respectively.

* * * * *